(12) United States Patent
Bamdhamravuri (10) Patent No.: US 11,829,640 B2
(45) Date of Patent: Nov. 28, 2023

(54) ASYNCHRONOUS ARBITRATION ACROSS CLOCK DOMAINS FOR REGISTER WRITES IN AN INTEGRATED CIRCUIT CHIP

(71) Applicant: Rambus Inc., San Jose, CA (US)

(72) Inventor: Srinivas Satish Babu Bamdhamravuri, Newbury Park, CA (US)

(73) Assignee: Rambus Inc., San Jose, CA (US)

( * ) Notice: Subject to any disclaimer, the term of this patent is extended or adjusted under 35 U.S.C. 154(b) by 76 days.

(21) Appl. No.: 17/451,754

(22) Filed: Oct. 21, 2021

(65) Prior Publication Data

US 2022/0129201 A1   Apr. 28, 2022

Related U.S. Application Data

(60) Provisional application No. 63/198,564, filed on Oct. 27, 2020.

(51) Int. Cl.
*G06F 3/06* (2006.01)

(52) U.S. Cl.
CPC .......... *G06F 3/0659* (2013.01); *G06F 3/0604* (2013.01); *G06F 3/0673* (2013.01)

(58) Field of Classification Search
CPC .... G06F 3/0659; G06F 3/0604; G06F 3/0673; G06F 13/42; G06F 13/1605; G06F 13/36; G06F 2213/36; G06F 12/00; H04L 2027/0087; H04L 2027/0089

See application file for complete search history.

(56) References Cited

U.S. PATENT DOCUMENTS

| | | | |
|---|---|---|---|
| 5,930,486 A * | 7/1999 | Looi | G06F 13/364 710/114 |
| 5,935,255 A | 8/1999 | So et al. | |
| 6,205,191 B1 | 3/2001 | Portmann et al. | |
| 6,357,015 B1 | 3/2002 | Yamakawa et al. | |
| 6,396,887 B1 | 5/2002 | Ware et al. | |
| 6,473,439 B1 | 10/2002 | Zerbe et al. | |
| 6,553,503 B1 | 4/2003 | Li | |
| 6,977,980 B2 | 12/2005 | Chang et al. | |
| 7,275,171 B2 | 9/2007 | Kizer et al. | |
| 7,350,092 B2 | 3/2008 | Reichel et al. | |
| 9,304,530 B1 | 4/2016 | Ware | |
| 10,776,051 B2 * | 9/2020 | Tsai | G06F 3/0688 |

(Continued)

*Primary Examiner* — Idriss N Alrobaye
*Assistant Examiner* — Richard B Franklin
(74) *Attorney, Agent, or Firm* — Lowenstein Sandler LLP (57) ABSTRACT

A buffer chip includes a first interface to receive in-band register access commands from a host and a second interface to receive side-band register access commands from the host. The buffer chip further includes an arbitration circuit coupled to the first interface and to the second interface, wherein the arbitration circuit is to receive control signals from the first interface indicating a first pending register access command for the first interface, and wherein the arbitration circuit is to select the first pending register access command from concurrent pending register access commands from the first interface and the second interface using the control signals. In addition, the buffer chip includes a command buffer register coupled to the arbitration circuit, wherein the arbitration circuit to perform, on the command buffer register, a register access operation corresponding to the first pending register access command.

20 Claims, 6 Drawing Sheets

(56) References Cited

U.S. PATENT DOCUMENTS

| | | |
|---|---|---|
| 11,099,762 B2 * | 8/2021 | Hyung ................ G06F 13/4027 |
| 2006/0047990 A1 | 3/2006 | James et al. |
| 2012/0239870 A1 | 9/2012 | Tung et al. |
| 2013/0013950 A1 | 1/2013 | Maddigan et al. |
| 2013/0043915 A1 | 2/2013 | Gupta |

* cited by examiner

ASYNCHRONOUS ARBITRATION ACROSS CLOCK DOMAINS FOR REGISTER WRITES IN AN INTEGRATED CIRCUIT CHIP

RELATED APPLICATIONS

This application claims the benefit of U.S. Provisional Patent Application Ser. No. 63/198,564, filed Oct. 27, 2020, the entire contents of which is hereby incorporated by reference herein.

BACKGROUND

Modern computer systems generally include a data storage device, such as a memory component. The memory component may be, for example a random access memory (RAM) or a dynamic random access memory (DRAM). The memory component includes memory banks made up of storage cells which are accessed by a memory controller through a command interface and a data interface within the memory component.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

A memory module may include a command buffer chip, such as a register clock driver (RCD) chip, to receive and re-drive command and address input signals transmitted from a host device to the specific memory devices of the module. Depending on the implementation, a command buffer chip can be used in a dual in-line memory module (DIMN) comprising a series of dynamic random access memory (DRAM) integrated circuits, such as a registered DINM (RDIMM) or a load reduced DINM (LRDIMM). The command buffer chip can include one or more registers that can store values used to program configuration and/or control settings of the command buffer, for example. In other embodiments, the registers can store other values and/or data. In certain command buffer chips, there are two separate interfaces by which these registers can be written. For example, the command buffer chip can include a high-speed in-band interface, as well as a low-speed side-band interface, by which a host device can communicate with the command buffer. The in-band interface can include a command/address (C/A) interface, for example, used to receive memory access commands and associated memory address information during normal operation of the memory module, as well as register access commands, also known as mode register set commands that specify a read or write to a control register. The in-band interface operates according to a high-speed clock (DCK). The side-band interface can include an inter-integrated circuit ($I^2C$) interface, or some other interface, that can be used to receive command buffer register writes during periods when the in-band interface is unavailable, such as before the in-band interface has been trained (i.e., synchronized with the high-speed clock). The side-band interface operates according to a lower-speed internal clock of the memory device. Since the side-band interface is independent from the in-band interface, the side-band interface also remains operable while the in-band interface is available. Accordingly, the command buffer can include some control logic to arbitrate between concurrent transactions on the in-band and side-band interfaces.

In a command buffer, register write operations received via the side-band interface may be written to the command buffer registers using the high-speed clock. Thus, in order for the side-band interface to be used, the high-speed clock must be operational, except in certain situations, such as if the command buffer is in a reset state or clock stop power down state. In addition, clock domain crossing (i.e., translation from the low-speed internal clock domain to the high-speed clock domain) is performed before the register write. The circuitry associated with the clock domain crossing adds to the complexity and size of the command buffer circuit, and the translation itself increases the latency of the associated memory access operations. In addition, the arbitration between concurrent transactions on the in-band and side-band interfaces is performed in the high-speed domain (i.e., using the high-speed clock after the clock domain crossing), which adds to the dependency of the side-band interface on the high-speed clock.

Aspects of the present disclosure address these and other deficiencies by providing an integrated circuit chip which is configured to perform asynchronous arbitration of register writes across clock domains. In one embodiment, the integrated circuit chip includes an arbitration circuit which receives control signals from the high-speed interface indicating when an in-band transaction (e.g., a mode register set command that specifies a write to command buffer register) is pending. When there are multiple concurrent pending register access commands from the high-speed and low-speed interfaces (i.e., multiple commands having corresponding operations that at least partially overlap in time), the arbitration circuit can select which register access commands to process using the received control signals. In one embodiment, the arbitration circuit is configured to prioritize pending register access commands for the high-speed interface over pending register access commands for the low-speed interface. For example, if a memory access operation (e.g., a command buffer write operation) associated with the low-speed interface is actively being performed when a register access command for the high-speed interface is received, the arbitration circuit can interrupt the active memory access operation, perform the memory access operation associated with the high-speed interface, and retry the register access operation associated with the low-speed interface during a subsequent clock cycle. For purposes of explanation, the arbitration circuit is described herein as being implemented in a command buffer chip, such as a register clock driver (RCD) chip. It should be appreciated, however, that the arbitration circuit and the arbitration techniques are applicable to any integrated circuit which performs arbitration for register access across two or more clock domains.

In one embodiment, the arbitration circuit includes meta-hardened flip-flop circuits to store a state of write enable signals for register access operations corresponding to pending register access commands for the low-speed interface. When received from the high-speed interface, the control signals reset the meta-hardened flip-flop circuits to disable the write enable signals and interrupt any active register access operations associated with the low-speed interface. This permits address and data signals for register access operations associated with the high-speed interface to be transmitted to a command buffer register without delay.

By implementing the arbitration circuit with meta-hardened flip-flop circuits, the arbitration circuit can operate according to the same internal clock used by the low-speed side-band interface. As a result, the clock domain crossing, and associated circuitry, are not needed which reduces the complexity and size of the command buffer circuit. In addition, the arbitration circuit is not dependent on the high-speed clock and can still process register access commands from the low-speed side-band interface when the high-speed clock is unavailable. At the same time, the arbitration circuit retains the ability to arbitrate between concurrent register access commands received from the high-speed and low-speed interfaces. Additional details of the command buffer chip and arbitration circuit are provided below with respect to FIGS. 1-5.

Figure 1:
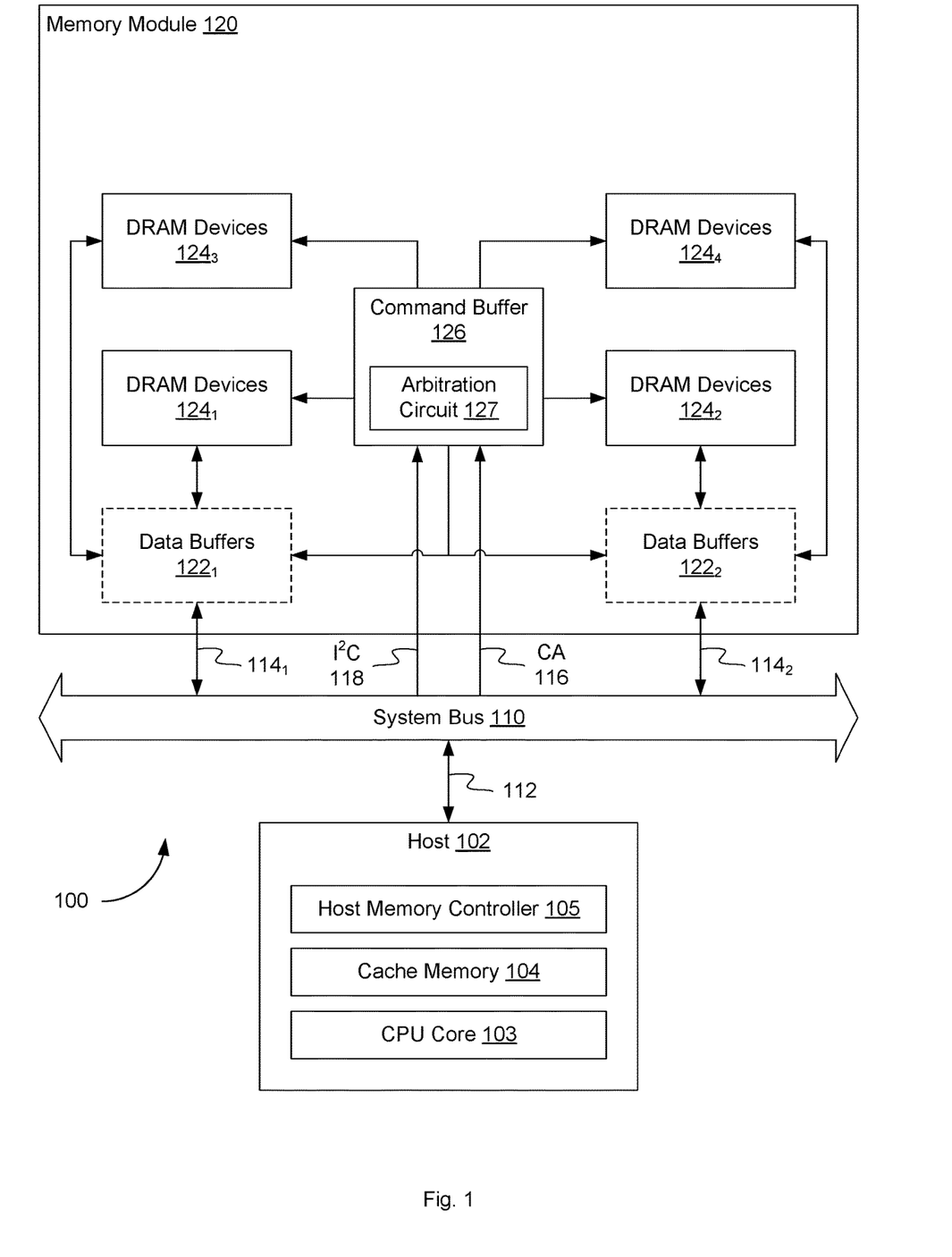
FIG. 1 is a block diagram illustrating a computing environment with a memory module including an integrated circuit chip with asynchronous arbitration of register writes across clock domains, according to an embodiment.

FIG. 1 depicts an environment 100 showing a memory module 120. As an option, one or more instances of environment 100 or any aspect thereof may be implemented in the context of the architecture and functionality of the embodiments described herein.

As shown in FIG. 1, environment 100 comprises a host 102 coupled to a memory module 120 through a system bus 110. In one embodiment, memory module 120 is a dual in-line memory module (DINM). Such memory modules can be referred to as DRAM DIMMs, registered DIMMs (RDIMMs), or load-reduced DIMMs (LRDIMMs), and can share a memory channel with other DRAM DIMMs.

In on embodiment, the host 102 further comprises a CPU core 103, a cache memory 104, and a host memory controller 105. Host 102 can comprise multiple instances each of CPU core 103, cache memory 104, and host memory controller 105. The host 102 of environment 100 can further be based on various architectures (e.g., Intel x86, ARM, MIPS, IBM Power, etc.). Cache memory 104 can be dedicated to the CPU core 103 or shared with other cores. The host memory controller 105 of the host 102 communicates with the memory module 120 through the system bus 110 using a physical interface 112 (e.g., compliant with the JEDEC DDR3, DDR4 or DDR5 SDRAM standard, etc.). Specifically, the host memory controller 105 can write data to and/or read data from multiple sets of volatile memory devices, such as DRAM devices $124_1$-$124_4$ using a data bus $114_1$ and a data bus $114_2$, respectively. For example, the data bus $114_1$ and the data bus $114_2$ can transmit the data as electronic signals such as a data signal, a chip select signal, or a data strobe signal. The DRAM devices $124_1$-$124_4$ can each comprise an array of eight or nine memory devices (e.g., SDRAM) arranged in various topologies (e.g., A/B sides, single-rank, dual-rank, quad-rank, etc.). In some cases, as shown, the data to and/or from the DRAM devices $124_1$-$124_4$ can optionally be buffered by a set of data buffers $122_1$ and data buffers $122_2$, respectively. Such data buffers can serve to boost the drive of the signals (e.g., data or DQ signals, etc.) on the system bus 110 to help mitigate high electrical loads of large computing and/or memory systems. In other embodiments, data buffers $122_1$ and data buffers $122_2$ are not present in memory module 120.

Further, commands from the host memory controller 105 can be received by a command buffer 126, such as a register clock driver (RCD), at the memory module 120 using a command and address (CA) bus 116. For example, the command buffer 126 might be an RCD such as included in registered DIMMs (e.g., RDIMMs, LRDIMMs, etc.). Command buffers such as command buffer 126 can comprise a logical register and a phase-lock loop (PLL) to receive and re-drive command and address input signals from the host memory controller 105 to the DRAM devices on a DIMM (e.g., DRAM devices $124_1$, DRAM devices $124_2$, etc.), reducing clock, control, command, and address signal loading by isolating the DRAM devices from the host memory controller 105 and the system bus 110. In some cases, certain features of the command buffer 126 can be programmed with configuration and/or control settings. In one embodiment, command and address bus 116 is coupled with a first interface (e.g., a high-speed in-band interface) of command buffer 126, and operates according to a first clock (e.g., a high-speed clock (DCK)). In addition, commands from the host memory controller 105 can be further received by command buffer 126 using an inter-integrated circuit ($I^2C$) bus 118. In one embodiment, I2C bus 118 is coupled with a second interface (e.g., a low-speed side-band interface) of command buffer 126, and operates according to a second clock (e.g., a lower-speed internal clock). The side-band interface can be used to receive command buffer register writes during periods when the in-band interface is unavailable, such as before the in-band interface has been trained.

In one embodiment, in addition to the high-speed and low-speed interfaces, command buffer 126 includes arbitration circuit 127 (i.e., a selection circuit). As described in more detail below, command buffer 126 can arbitrate between concurrent register access commands associated with the high-speed and low-speed interfaces. In one embodiment, arbitration circuit 127 receives control signals from the high-speed interface indicating when an in-band transaction is pending. When there are multiple concurrent pending register access commands from the high-speed and low-speed interfaces, arbitration circuit 127 can select which register access commands to process using the received control signals. For example, arbitration circuit 127 can prioritize pending register access commands for the high-speed interface over pending register access commands for the low-speed interface. In one embodiment, if a register access operation (e.g., a command buffer write operation) associated with the low-speed interface is actively being performed when a register access command for the high-speed interface is received, arbitration circuit 127 can interrupt the active register access operation, perform the register access operation associated with the high-speed interface, and retry the register access operation associated with the low-speed interface during a subsequent clock cycle.

The memory module 120 shown in environment 100 presents merely one partitioning. The specific example shown where the command buffer 126 and the DRAM devices 124₁-124₄ are separate components is purely exemplary, and other partitioning is possible. For example, any or all of the components comprising the memory module 120 and/or other components can comprise one device (e.g., system-on-chip or SoC), multiple devices in a single package or printed circuit board, multiple separate devices, and can have other variations, modifications, and alternatives.

Figure 2:
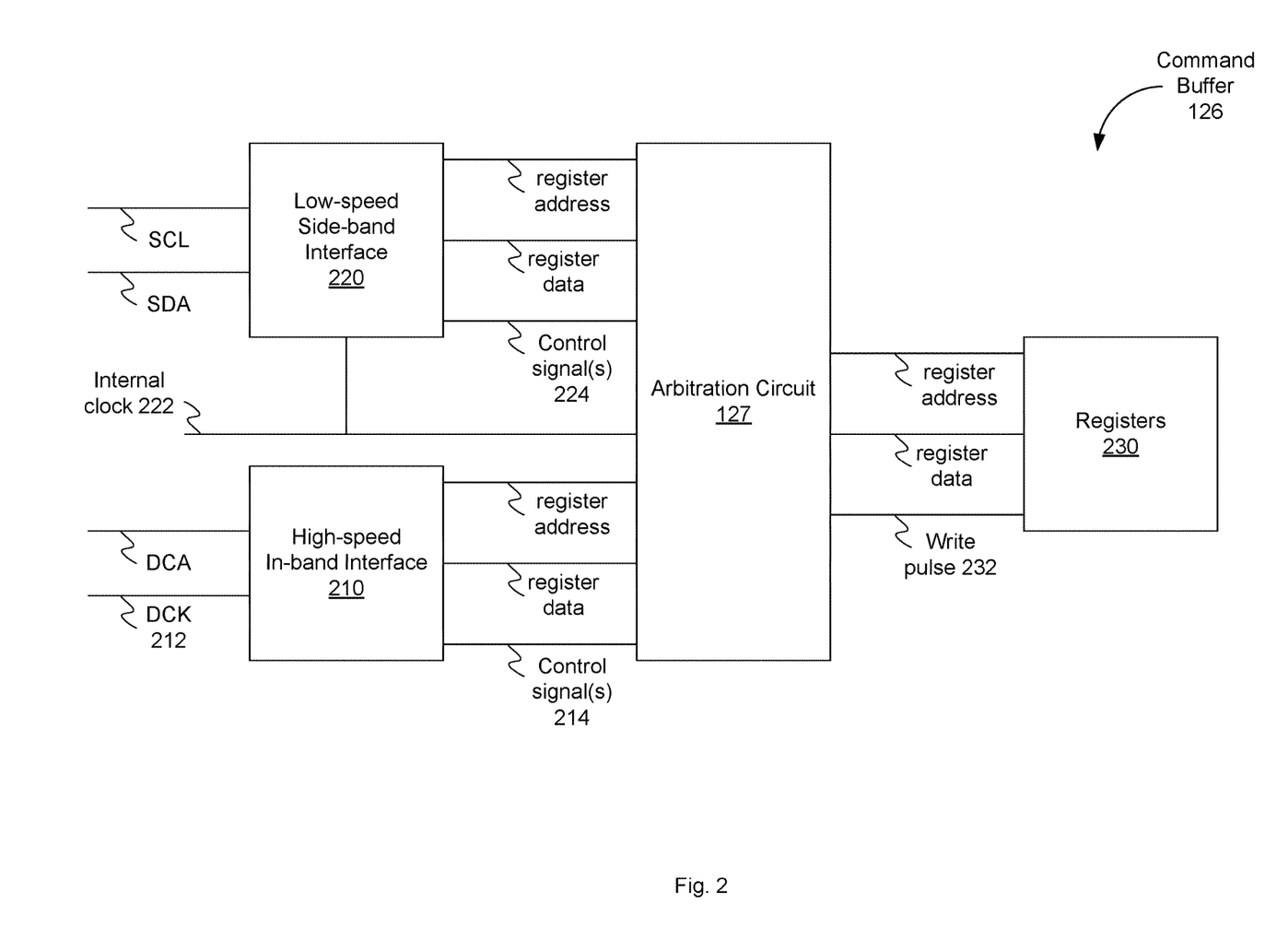
FIG. 2 is a block diagram illustrating an integrated circuit chip with asynchronous arbitration of register writes across clock domains, according to an embodiment.

FIG. 2 is a block diagram illustrating a command buffer chip with asynchronous arbitration of register writes across clock domains, according to an embodiment. As shown in FIG. 2, command buffer 126 includes a first interface (e.g., high-speed in-band interface 210), a second interface (e.g., low-speed side-band interface 220), arbitration circuit 127, and one or more command buffer registers 230. The one or more command buffer registers 230 can store values used to program configuration and/or control settings of the command buffer, for example. In other embodiments, the registers can store other values and/or data.

Either of high-speed interface 210 or low-speed interface 220 can receive register access commands (e.g., register write commands) which trigger register access operations on the one or more command buffer registers 230. In one embodiment, high-speed interface 210 can include a command/address (C/A) interface, for example, used to receive register access commands and associated memory address information (e.g., DRAM cache aware (DCA) communications), during normal operation (i.e., in-band communications). For example, high-speed interface 210 can be coupled, via a C/A bus or other communications bus, to a requestor, such as host 102 of FIG. 1. In one embodiment, the in-band interface operates according to a first clock (e.g., a high-speed clock (DCK) 212), which can also be received from the requestor. Low speed interface 220 can include, for example, an inter-integrated circuit (I²C) interface, an I³C interface, or some other interface, that can be used to receive register access commands and data (e.g., a serial data signal (SDA)) during periods when the high-speed interface 210 is unavailable (i.e., side-band communications). For example, low-speed interface 220 can be coupled, via a communications bus, to the requestor, such as host 102 of FIG. 1. The side-band interface operates according to a second clock (e.g., a lower-speed internal clock 222) of the memory device. The internal clock 222 can have a lower frequency than high-speed clock 212, but can have a higher frequency than a serial clock line (SCL) in the system. Since low-speed interface 220 is independent from high-speed interface, low-speed also remains operable while high-speed interface is available. Accordingly, arbitration circuit 127 can arbitrate between concurrent transactions on high-speed interface 210 and low-speed interface 220.

In one embodiment, upon receiving respective register access commands, both of high-speed interface 210 and low-speed interface 220 can send register address information, register data information, and control signals to arbitration circuit 127. For example, high-speed interface 210 can provide control signals 214 and low-speed interface 220 can provide control signals 224. Based on at least some of the control signals 214 and 224, arbitration circuit can select certain register access commands of concurrent register accesses from high-speed interface 210 and low-speed interface 220 to process. For example, if a register access operation associated with low-speed interface 220 is actively being performed when a register access command for high-speed interface 210 is received, arbitration circuit 127 can interrupt the active register access operation, perform the register access operation associated with high-speed interface 210, and retry the register access operation associated with low-speed interface 220 at a later time. In general, arbitration circuit 127 will prioritize pending register access commands for high-speed interface 210 over pending register access commands for low-speed interface 220. Upon selecting a register access operation, arbitration circuit 127 can forward the corresponding register address information, register data information, and a corresponding write pulse 232 to the one or more command buffer registers 230.

Figure 3:
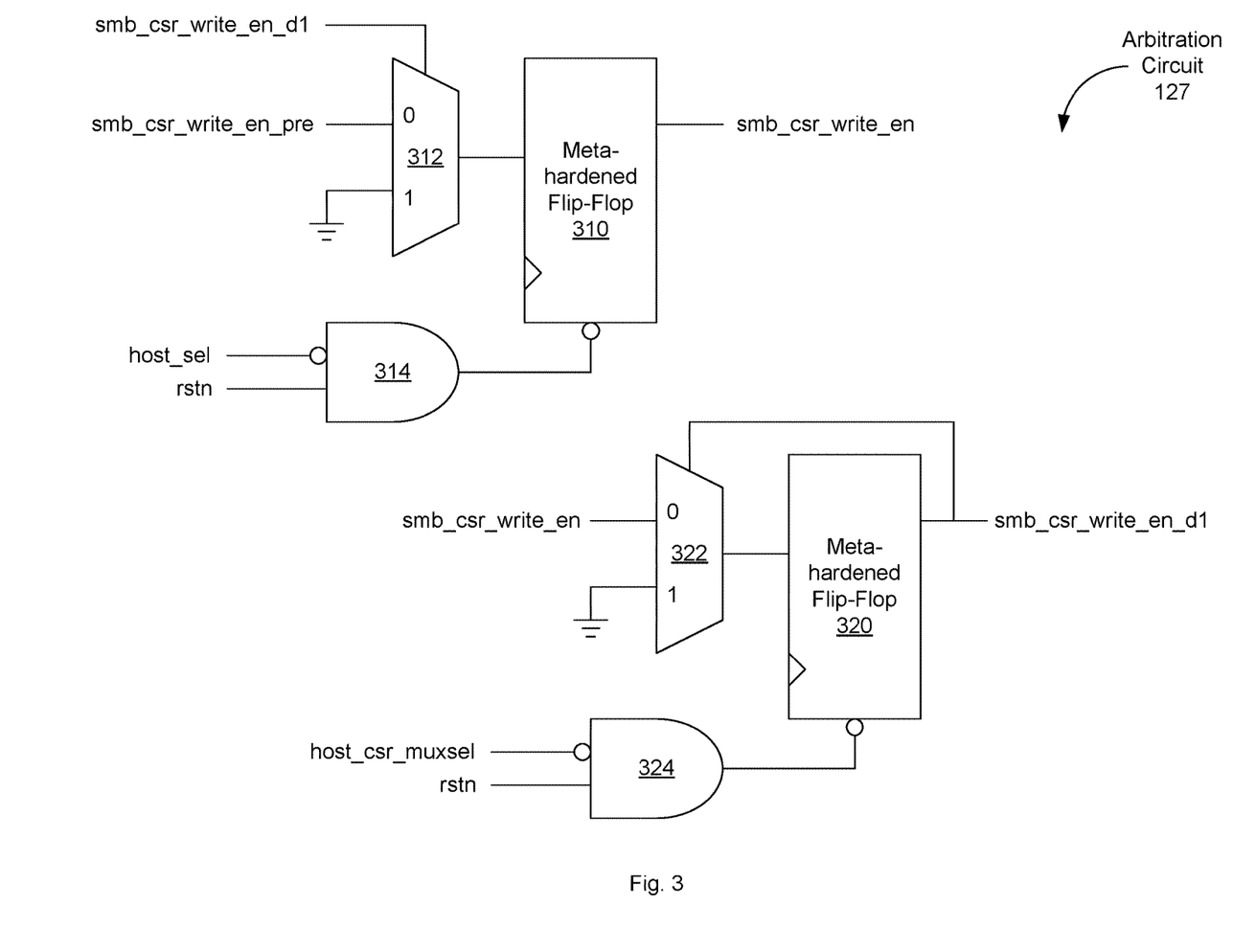
FIG. 3 is a block diagram illustrating an arbitration circuit in an integrated circuit chip for asynchronous arbitration of register writes across clock domains, according to an embodiment.

FIG. 3 is a block diagram illustrating an arbitration circuit in a command buffer circuit for asynchronous arbitration of register writes across clock domains, according to an embodiment. As illustrated in FIG. 3, arbitration circuit 127 includes a number of meta-hardened flip-flop circuits, such as 310 and 320.

As noted above, the high-speed interface 210 and the low-speed interface 220/arbitration circuit 127 operate in different timing domains (i.e., utilize different clock signals having different frequencies) and thus, are asynchronous. In order for the input signals (e.g., register address signals, register data signals, and control signals) from an asynchronous source to be usable, the arbitration circuit 217 can synchronize the input signals to a reference clock signal (e.g., internal clock 222). One option for this synchronization is to use a bi-stable latch or other storage element, such as a flip-flop. Since the input signals are asynchronous to the reference clock, however, a timing violation event may occur where there is inadequate setup time (i.e., the amount of time for which the input signal must be stable before the reference clock transitions to store the input signal in the flip-flop) or inadequate hold time (i.e., the required time for an output signal of the flip-flop to change state to the value of the input signal). Such an event could cause the output signal of a flip-flop to be an unknown state or significantly delayed, and is attributable to "metastability." Meta-hardened flip-flops 310 and 320 (also referred to as meta-sync flip flops), however, do not suffer from this deficiency as their design ensures that the output signal will flip high or low, even during the occurrence of a timing violation event, as described above.

In one embodiment, each of meta-hardened flip-flop circuits 310 and 320 receives a respective input signal from low-speed interface 220 (i.e., control signals 224) via a corresponding selection device 312 and 322 (e.g., multiplexers). For example, selection device 312 receives a signal smb_csr_write_en_pre (e.g., indicating whether a prior transaction is complete) and provides that signal as an input to meta-hardened flip-flop 310 while selection device 322 receives a signal smb_csr_write_en (e.g., a write enable signal for the current transaction) and provides that signal as an input to meta-hardened flip-flop 320. In one embodiment, both selection devices 312 and 322 are controlled by a signal smb_csr_write_en_d1 (e.g., an output of meta-hardened flip-flop 320).

In one embodiment, each of meta-hardened flip-flop circuits 310 and 320 further receives a respective reset signal from high-speed interface 210 (i.e., control signals 214) via a corresponding logic device 314 and 324 (e.g., AND gates). For example, logic device 314 receives a signal host_sel (e.g., indicating the presence of a pending register access operation for the high-speed interface 210), combines it with a reference signal (rstn) and provides the result as a reset signal to meta-hardened flip-flop 310. Similarly, logic device 324 receives a signal host_csr_muxsel (e.g., indicating an active register access operation for the high-speed interface 210), combines it with the reference signal (rstn) and provides the result as a reset signal to meta-hardened flip-flop 320. Accordingly, when either of the control signals 214 from high-speed interface 210 (i.e., host_sel or host_csr_muxsel) are asserted, the corresponding one(s) of meta-hardened flip-flops 310 and 320 are reset to disable the output write enable signals associated with the low-speed interface 220 (i.e., smb_csr_write_en or smb_csr_write_en_d1). Thus, arbitration circuit 127 can instead issue write enable signals associated with high-speed interface 210 and register access operations corresponding to the pending register access commands from high-speed interface 210 can be performed. Upon completion of those operations, the control signals 214 from high-speed interface 210 are de-asserted, taking meta-hardened flip-flops 310 and 320 out of the reset state and permitting the output write enable signals associated with the low-speed interface 220 to be applied and register access operations corresponding to the pending register access commands from low-speed interface 220 can be performed.

Figure 4A:
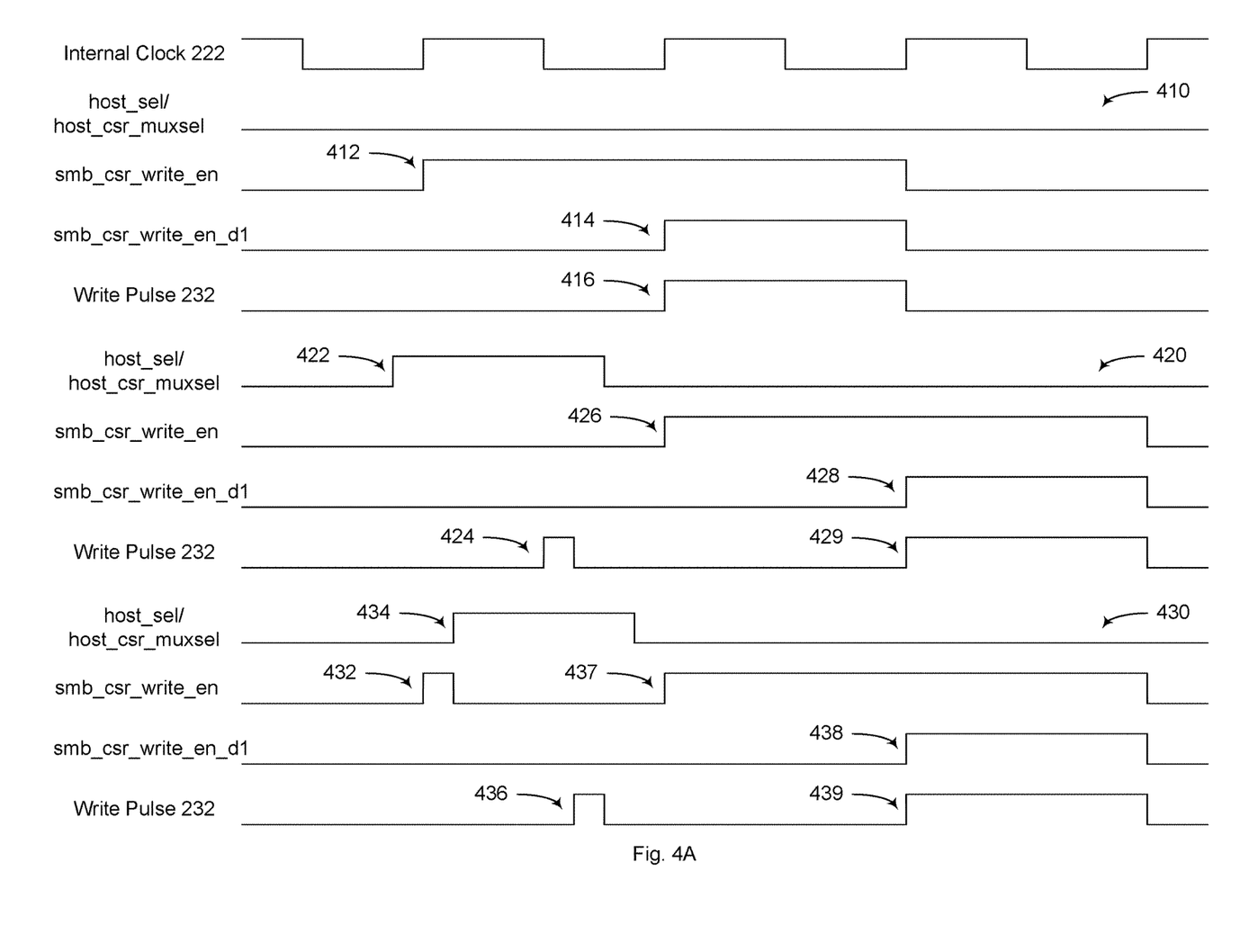
FIGS. 4A and 4B are timing diagrams illustrating asynchronous arbitration of register writes across clock domains, according to an embodiment.
Figure 4B:
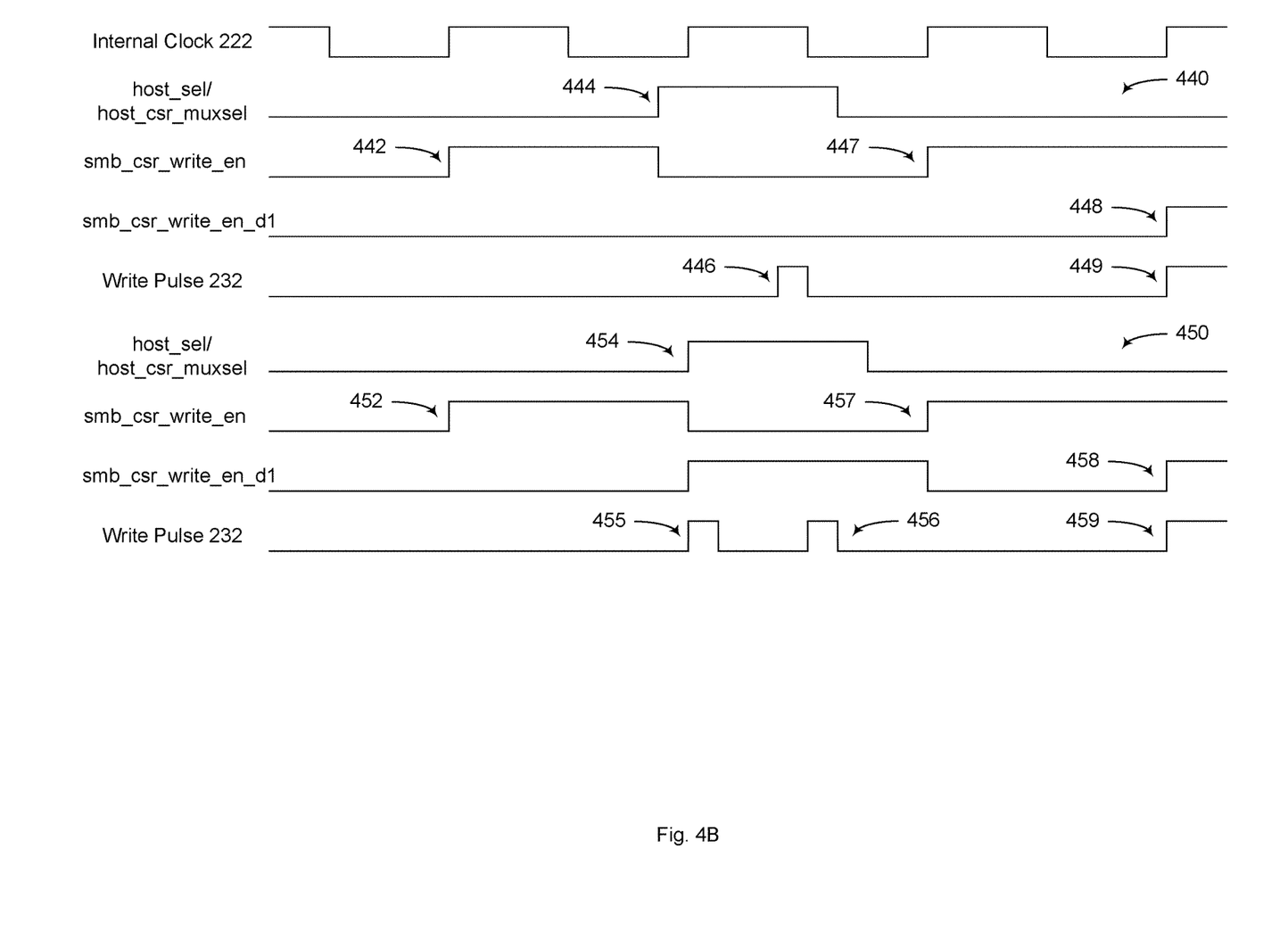

FIGS. 4A and 4B are timing diagrams illustrating asynchronous arbitration of register writes across clock domains, according to an embodiment. FIGS. 4A and 4B illustrate the operation of arbitration circuit 127 to select and process one of multiple concurrent register access operations associated with high-speed interface 210 and low-speed interface 220 of command buffer 126 in a number of different cases 410-450. As described above, arbitration circuit 127 operates according to the frequency of internal clock 222.

Referring to FIG. 4A, in case 410, there are no pending register access operations associated with high-speed interface 210 This is indicated by the control signals 214 (i.e., host_sel and host_csr_muxsel) remaining low throughout the illustrated period of time. Thus, when a pending register access command (e.g., a register write command) associated with low-speed interface 220 is received, which is indicated by the signal smb_csr_write_en going high at 412, arbitration circuit 127 will output the signal smb_csr_write_en_d1 at 414 to trigger the write pulse 232 at 416 and a corresponding register access operation (e.g., a register write operation) is performed on command buffer registers 230. As described with respect to FIG. 3, since host_sel and host_csr_muxsel remain low, meta-hardened flip-flops 310 and 320 are not reset, allowing arbitration circuit 127 to output the signals smb_csr_write_en and smb_csr_write_en_d1 and perform the register access operation corresponding to the pending register access command for low-speed interface 220.

In case 420, however, there is a pending register access operation associated with high-speed interface 210. This is indicated by the control signals 214 (i.e., host_sel and host_csr_muxsel) going high at 422 for a portion of the illustrated period of time. In case 420, the register access command associated with high-speed interface 210 is received before any register access command associated with low-speed interface 220. Accordingly, at 424 write pulse 232 triggers a register access operation (e.g., a register write operation) associated with high-speed interface on command buffer registers 230. Even if a register access command associated with low-speed interface 20 were received, such would be delayed until after the high-speed register access operation is complete. When host_sel and host_csr_muxsel are high, meta-hardened flip-flops 310 and 320 are reset, and arbitration circuit 127 does not output the signals smb_csr_write_en and smb_csr_write_en_d1. Only after the high-speed register access operation is complete, and host_sel and host_csr_muxsel are low, the signal smb_csr_write_en goes high at 426, arbitration circuit 127 will output the signal smb_csr_write_en_d1 at 428 to trigger the write pulse 232 at 429 and a corresponding low-speed register access operation (e.g., a register write operation) is performed on command buffer registers 230.

In case 430, a register access command associated with high-speed interface 210 is received after a register access command associated with low-speed interface 220. As illustrated, the signal smb_csr_write_en associated with the low-speed interface 220 goes high at 432, and subsequently the control signals 214 (i.e., host_sel and host_csr_muxsel) associated with high-speed interface 210 go high at 434. When host_sel and host_csr_muxsel are high, meta-hardened flip-flops 310 and 320 are reset, and arbitration circuit 127 does not output the signals smb_csr_write_en and smb_csr_write_en_d1, and so the low-speed register access operation is interrupted. At 436 write pulse 232 triggers a register access operation (e.g., a register write operation) associated with high-speed interface on command buffer registers 230. After the high-speed register access operation is complete, and host_sel and host_csr_muxsel are low, the signal smb_csr_write_en goes high at 437, arbitration circuit 127 will output the signal smb_csr_write_en_d1 at 438 to trigger the write pulse 232 at 439 and a corresponding low-speed register access operation (e.g., a register write operation) is performed on command buffer registers 230.

Referring to FIG. 4B, in case 440, a register access command associated with high-speed interface 210 is received after a register access command associated with low-speed interface 220. As illustrated, the signal smb_csr_write_en associated with the low-speed interface 220 goes high at 442, and subsequently the control signals 214 (i.e., host_sel and host_csr_muxsel) associated with high-speed interface 210 go high at 444. When host_sel and host_csr_muxsel are high, meta-hardened flip-flops 310 and 320 are reset, and arbitration circuit 127 does not output the signals smb_csr_write_en and smb_csr_write_en_d1, and so the low-speed register access operation is interrupted. At 446 write pulse 232 triggers a register access operation (e.g., a register write operation) associated with high-speed interface on command buffer registers 230. After the high-speed register access operation is complete, and host_sel and host_csr_muxsel are low, the signal smb_csr_write_en goes high at 447, arbitration circuit 127 will output the signal smb_csr_write_en_d1 at 448 to trigger the write pulse 232 at 449 and a corresponding low-speed register access operation (e.g., a register write operation) is performed on command buffer registers 230.

In case 450, a register access command associated with high-speed interface 210 is again received after a register access command associated with low-speed interface 220. As illustrated, the signal smb_csr_write_en associated with the low-speed interface 220 goes high at 452, and subsequently the control signals 214 (i.e., host_sel and host_csr_muxsel) associated with high-speed interface 210 go high at 454. When host_sel and host_csr_muxsel are high, meta-hardened flip-flops 310 and 320 are reset, and arbitration circuit 127 does not output the signals smb_csr_write_en and smb_csr_write_en_d1, and the low-speed register access operation would normally be interrupted. In case 450, however, since the low-speed register access operation is nearly complete (i.e., smb_csr_write_en has been high for an adequate amount of time), write pulse 232 is triggered at 455 and the low-speed register access operation is performed. Then, at 456 write pulse 232 triggers a register access operation (e.g., a register write operation) associated with high-speed interface on command buffer registers 230. After the high-speed register access operation is complete, and host_sel and host_csr_muxsel are low, the signal smb_csr_write_en goes high at 457, arbitration circuit 127 will output the signal smb_csr_write_en_d1 at 458 to trigger the write pulse 232 at 459 and a corresponding low-speed register access operation (e.g., a register write operation) is performed on command buffer registers 230. Thus, the low-speed register write operations is repeated.

Figure 5:
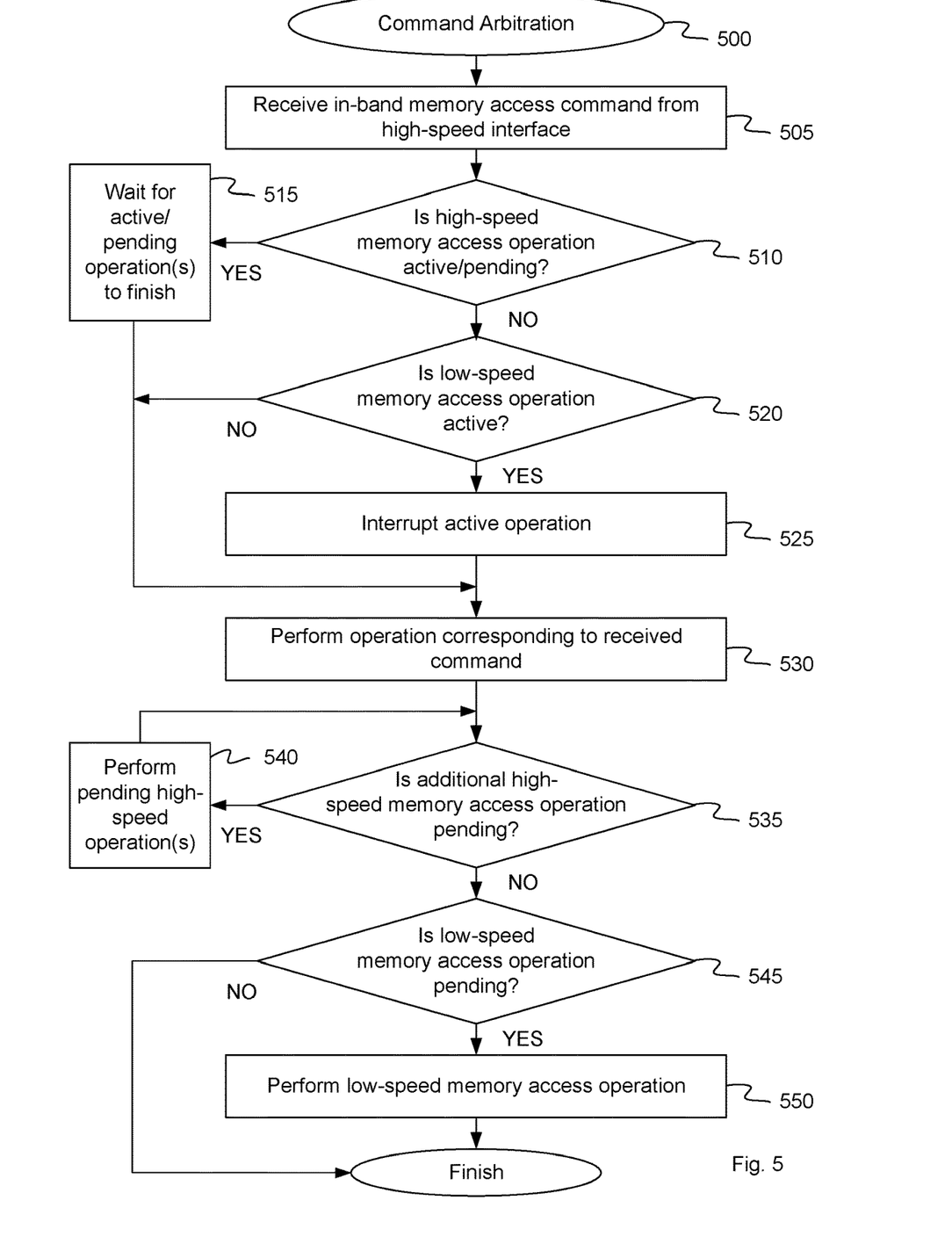
FIG. 5 is a flow diagram illustrating a method for asynchronous arbitration of register writes across clock domains, according to an embodiment.

FIG. 5 is a flow diagram illustrating a method for asynchronous arbitration of register writes across clock domains, according to an embodiment. The method 500 may be performed by processing logic that may comprise hardware (e.g., circuitry, dedicated logic, programmable logic, microcode, etc.), software (e.g., instructions run on a processing device to perform hardware simulation), firmware, or a combination thereof. The processing logic may select one or more of multiple concurrent pending register access commands from a high-speed interface 210 and a low-speed interface 220 of a command buffer chip 126. In one embodiment, the method 500 is performed by arbitration circuit 127 of command buffer chip 126, as shown in FIGS. 1-3.

Referring to FIG. 5, at operation 505, the processing logic receives an in-band register access command (e.g., a register write command) from high-speed interface 210. At operation 510, the processing logic determines whether a register access operation corresponding to another register access command from the high-speed interface 210 (i.e., a high-speed register access operation) is actively being performed and/or pending (i.e., waiting to be performed). If so, at operation 515, the processing logic waits for the active and/or pending operation or operations to finish (i.e., the register write operation to be completed). If a high-speed register access operation is not active and/or pending, at operation 520, the processing logic determines whether a register access operation corresponding to a register access command from the low-speed interface 220 (i.e., a low-speed register access operation) is actively being performed. If so, at operation 525 the processing logic interrupts the active low-speed register access operation. In one embodiment, arbitration circuit 127 receives control signals 214 (i.e., host_sel or host_csr_muxsel) from high-speed interface 210 which reset meta-hardened flip-flops 310 and 320 to disable the output write enable signals associated with the low-speed interface 220. At operation 530, the processing logic performs the register access operation corresponding to the register access command received at operation 505. In one embodiment, with meta-hardened flip-flops in a reset state, arbitration circuit 127 can instead issue write enable signals associated with high-speed interface 210 and register access operations corresponding to the pending register access commands from high-speed interface 210 can be performed.

At operation 535, the processing logic determines whether any additional register access operations corresponding to other register access commands from the high-speed interface 210 (i.e., high-speed register access operations) are pending. If so, at operation 540, the processing logic performs those pending high-speed register access operations. If no additional high-speed register access operations are pending, at operation 545, the processing logic determines whether a register access operation corresponding to a register access command from the low-speed interface 220 (i.e., a low-speed register access operation) is pending. For example if a low-speed register access operation was interrupted at operation 525, or if another register access command was received at low=−speed interface 220 while the high-speed register access operations were being performed, then arbitration circuit 127 can determine that a low-speed register access operation is pending. If so, at operation 550, the processing logic performs the low-speed register access operation. In one embodiment, when the control signals 214 from high-speed interface 210 are de-asserted, meta-hardened flip-flops 310 and 320 are taken out of the reset state, the output write enable signals associated with the low-speed interface 220 can be applied, and register access operations corresponding to the pending register access commands from low-speed interface 220 can be performed.

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

What is claimed is:

1. A buffer chip comprising:
   a first interface to receive in-band register access commands from a host;
   a second interface to receive side-band register access commands from the host;
   an arbitration circuit coupled to the first interface and to the second interface, wherein the arbitration circuit is to receive control signals from the first interface indicating a first pending register access command for the first interface, and wherein the arbitration circuit is to select the first pending register access command from concurrent pending register access commands from the first interface and the second interface using the control signals; and
   a command buffer register coupled to the arbitration circuit, wherein the arbitration circuit to perform, on the command buffer register, a register access operation corresponding to the first pending register access command.

2. The buffer chip of claim 1, wherein the arbitration circuit is to prioritize the first pending register access command for the first interface over a second pending register access command for the second interface.

3. The buffer chip of claim 2, wherein responsive to receiving the control signals, the arbitration circuit is to interrupt an active register access operation corresponding to the second pending register access command, perform the register access operation corresponding to the first pending register access command, and retry the register access operation corresponding to the second pending register access command.

4. The buffer chip of claim 1, wherein the arbitration circuit comprises a plurality of flip-flop circuits to store a state of write enable signals for register access operations corresponding to pending register access commands for the second interface.

5. The buffer chip of claim 4, wherein the control signals from the first interface are to reset the plurality of flip-flop circuits to disable the write enable signals and interrupt the register access operations corresponding to the pending register access commands for the second interface.

6. The buffer chip of claim 1, wherein the first interface uses a first clock.

7. The buffer chip of claim 6, wherein the second interface uses a second internal clock, and wherein the second internal clock is lower speed than the first clock.

8. The buffer chip of claim 7, wherein the arbitration circuit uses the second internal clock.

9. A memory module comprising:
   one or more volatile memory devices; and
   a command buffer coupled to the one or more volatile memory devices, the command buffer comprising:
     a first interface to receive in-band register access commands from a host;
     a second interface to receive side-band register access commands from the host;
     an arbitration circuit coupled to the first interface and to the second interface, wherein the arbitration circuit is to receive control signals from the first interface indicating a first pending register access command for the first interface, and wherein the arbitration circuit is to select the first pending register access command from concurrent pending register access commands from the first interface and the second interface using the control signals; and
     a command buffer register coupled to the arbitration circuit, wherein the arbitration circuit to perform, on the command buffer register, a register access operation corresponding to the first pending register access command.

10. The memory module of claim 9, wherein the arbitration circuit is to prioritize the first pending register access command for the first interface over a second pending register access command for the second interface.

11. The memory module of claim 10, wherein responsive to receiving the control signals, the arbitration circuit is to interrupt an active register access operation corresponding to the second pending register access command, perform the register access operation corresponding to the first pending register access command, and retry the register access operation corresponding to the second pending register access command.

12. The memory module of claim 9, wherein the arbitration circuit comprises a plurality of meta-hardened flip-flop circuits to store a state of write enable signals for register access operations corresponding to pending register access commands for the second interface.

13. The memory module of claim 12, wherein the control signals from the first interface are to reset the plurality of meta-hardened flip-flop circuits to disable the write enable signals and interrupt the register access operations corresponding to the pending register access commands for the second interface.

14. The memory module of claim 9, wherein the first interface uses a first clock.

15. The memory module of claim 14, wherein the second interface uses a second internal clock, and wherein the second internal clock is lower speed than the first clock.

16. The memory module of claim 15, wherein the arbitration circuit uses the second internal clock.

17. The memory module of claim 9, wherein the one or more volatile memory devices comprise dynamic random access memory (DRAM) devices.

18. An arbitration circuit comprising:
- a first interface to receive control signals indicating a first pending register access command for a first interface of an integrated circuit chip comprising the arbitration circuit; and
- a selection circuit coupled to the first interface to select the first pending register access command from concurrent pending register access commands from the first interface and a second interface of the integrated circuit chip using the control signals, wherein the selection circuit comprises a plurality of flip-flop circuits to store a state of write enable signals for register access operations corresponding to pending register access commands for the second interface.

19. The integrated circuit of claim 18, wherein responsive to receiving the control signals, the selection circuit is to interrupt an active register access operation corresponding to a second pending register access command, perform the register access operation corresponding to the first pending register access command, and retry the register access operation corresponding to the second pending register access command.

20. The integrated circuit of claim 18, wherein the control signals from the first interface are to reset the plurality of flip-flop circuits to disable the write enable signals and interrupt the register access operations corresponding to the pending register access commands for the second interface.

* * * * *